United States Patent
Kishimoto et al.

[19]

[11] Patent Number: 6,033,990
[45] Date of Patent: Mar. 7, 2000

[54] METHOD FOR MANUFACTURING A MULTILEVEL INTERCONNECTION STRUCTURE

[75] Inventors: Koji Kishimoto; Kenichi Koyanagi, both of Tokyo, Japan

[73] Assignee: NEC Corporation, Tokyo, Japan

[21] Appl. No.: 09/034,776

[22] Filed: Mar. 4, 1998

[30] Foreign Application Priority Data

Mar. 12, 1997 [JP] Japan ................................. 9-057731

[51] Int. Cl.[7] ...................... H01L 21/00; H01L 21/3065
[52] U.S. Cl. ......................................................... 438/710
[58] Field of Search ................................. 438/637, 676, 438/777, 710

[56] References Cited

U.S. PATENT DOCUMENTS

| | | | |
|---|---|---|---|
| 4,582,563 | 4/1986 | Hazuki et al. | 438/641 |
| 5,007,983 | 4/1991 | Lerner et al. | 438/725 |
| 5,346,578 | 9/1994 | Benzing et al. | 156/345 |
| 5,399,527 | 3/1995 | Tabara | 438/625 |

FOREIGN PATENT DOCUMENTS

| | | |
|---|---|---|
| 1-196819 | of 1989 | Japan . |
| 2-26025 | of 1990 | Japan . |
| 4-23323 | of 1992 | Japan . |

OTHER PUBLICATIONS

Japanese Office Action dated Aug. 17, 1999 together with cited references, Japanese wavy line material and English translation thereof, Yasuhiro Horiike and Haruo Shindo, Jul. 27, 1994, p.576.

Japanese Office Action dated Aug. 17, 1999 together with cited references, Japanese wavy line material and English translation thereof.

*Primary Examiner*—Benjamin L. Utech
*Assistant Examiner*—Lynette T. Umez-Eronini
*Attorney, Agent, or Firm*—Laff, Whitesel & Saret, Ltd.; J. Warren Whitesl

[57] ABSTRACT

A method for fabricating a semiconductor device on a silicon substrate comprises the step of high-frequency plasma-treatment for through-hole before filling the through-hole with a metallic layer for connection. The plasma contains argon, oxygen and hydrogen atoms wherein the ratio of oxygen atoms to the total of the oxygen and hydrogen atoms in number is between 1/3 and 1/100. The silicon substrate is applied with a high-frequency bias voltage during the plasma treatment for acceleration of argon ion.

14 Claims, 9 Drawing Sheets

METHOD FOR MANUFACTURING A MULTILEVEL INTERCONNECTION STRUCTURE

BACKGROUND OF THE INVENTION (a) Field of the Invention

The present invention relates to a method for manufacturing a multilevel interconnection structure and, more particularly, to a technique for cleaning a through-hole in a semiconductor device before forming an overlying interconnect layer.

(b) Description of the Related Art

With a development of a finer interconnect pattern in a semiconductor device, the spacing between adjacent interconnects are increasingly reduced. On the other hand, the thickness of the interlevel dielectric film tends to increase. This is partly because cross-talk should be reduced between adjacent interconnect layers in a logic LSI, and partly because a large step difference formed between the cell area and the peripheral area requests a planarization step for the surface of an interlevel dielectric film in view of the improvement in the focus margin during a photolithographic step in the fabrication of a DRAM device.

Both the decrease of the spacing in the interconnect pattern and the increase of the thickness of the interlevel dielectric film increase the aspect ratio of a through-hole for a contact of a diffused region or a via between interconnect layers. In a current dry-etching technique for forming a deep through-hole, reactive ion etching (RIE) having a high anisotropic property is generally employed in a low pressure ambient while simultaneously depositing and etching fluorocarbon based deposits on the inner wall of the through-hole. In view of the high integration of the LSI, a through-hole that penetrates a plurality of interlevel dielectric films should be designed as vertical as possible, which renders the through-hole to have a higher aspect ratio.

In the dry-etching of a dielectric film, the underlying layer, which may be silicon in the case of a contact for a diffused region or a metal such as aluminum in the case of an interconnect layer, should not over-etched, which requests a higher selective ratio in the etching between the dielectric film and the underlying layer.

Especially, in the case of a through-hole for a diffused region (specifically referred to as a contact-hole hereinafter), a silicon oxide film should be etched with a high selective ratio between silicon oxide and silicon. A method for forming a vertical contact-hole having a high aspect ratio is described in literature "Generation of High-frequency and High-density Plasma and its Process Application", proceedings of 41st Semiconductor Special Seminar, pp153, for example. The literature recites a process using a high-density plasma source in a low pressure, such as induction coupling plasma, while applying a high-frequency power to a semiconductor substrate. In this process, however, if a source gas having a lower atomic ratio of C/F, such as $CHF_3$, is used as the high-density plasma source, there arises a problem in that its high decomposition rate generates excess fluorine ions or fluorine radicals in the process, thereby causing undesirable etching of the underlying silicon at the bottom of the contact-hole.

The above problem may be overcome to some extent by using a high C/F ratio source gas, such as $C_4F_8$, so as to suppress the etching of the underlying silicon. In this case, a hard film having a low fluorine ratio can cover the silicon surface to protect the same against ion collisions. The selective ratio between silicon oxide and silicon may be further improved by adding $H_2$ to suppress the etch rate of the silicon due to the function of hydrogen atoms for removing excess fluorine in the from of HF.

In such a condition, however, fluorocarbon based materials are generally deposited on the silicon surface just after the silicon surface is exposed by the etching, thereby filling the resultant contact-hole. Especially, if there are a large number of contact-holes having different depths, an over-etching of the deeper contact-holes fills the shallower contact-holes with the fluorocarbon based deposits. The removal of the fluorocarbon based deposits is difficult to achieve in the contact-holes having small sizes and high aspect ratios even by a combination of oxygen plasma ashing and a wet etching.

In addition, a native oxide film is generally formed on the silicon surface, after the formation of the contact-holes, in the case of the oxygen plasma ashing and the wet etching. The native oxide film may be removed by a wet treatment using dilute hydrofluoric (HF) acid before sputtering a barrier metal for formation of a titanium film or titanium nitride film. However, the small-sized and deep contact-hole again retards the effective removal of the native oxide film in this case. In summary, a dry-cleaning step is necessary for the removal of the fluorocarbon based deposits in the contact-holes and the native oxide film from the bottom of the contact-holes.

In the case of through-holes for connecting adjacent interconnect layers (specifically referred to as via-holes hereinafter), fluorocarbon based materials are deposited in the via-holes and an alumina ($Al_2O_3$) film is formed on the underlying aluminum interconnects. Dilute hydrofluoric acid should not be used for the via-holes because of the etching of the metal by the hydrofluoric acid. A physical sputtering using argon and a high-frequency power is attempted to remove an oxide film; however, it is not effective in the case of small-sized and high-aspect ratio via-holes. On the contrary, fluorocarbon based materials are deposited in the via-holes in the physical sputtering, deposits of silicon oxide films remain in the via-holes as a result of the etching of the interlayer dielectric film, and an alumina film remains in the bottom of the via-holes.

After formation of a through-hole, tungsten is generally used as a conductive material in the through-hole, and a titanium film and a titanium nitride film are generally used as underlying barrier layers. The native oxide film in the contact-hole or the alumina film in the via-hole raises the contact resistance or causes a connection defect, i.e., an open-circuit failure. On the other hand, the fluorocarbon based deposits causes voids or peel-off in the through-hole after subsequent thermal treatments at around 400° C. or above, thereby degrading the reliability of the through-holes. The fluorocarbon based deposits also sometime cause a connection defect itself.

In view of the above, in the current fabrication process of semiconductor devices, a pretreatment is generally conducted for removing fluorocarbon based deposits and oxide films before sputtering a barrier metal. An example of the pretreatment is described in Patent Publication JP-A-1 (1989)-196819, for example.

In the Patent Publication, as shown in FIG. 1A, a contact-hole 704 is formed in an insulator film 703 for exposing a diffused region 702 of a silicon substrate 701, followed by a plasma treatment by hydrogen ions 707 generated in a hydrogen plasma, as shown in FIG. 1B, thereby removing a native oxide film 705 on the silicon surface by the deoxidizing function of the hydrogen. In this step, the hydrogen ions are generated by an electron cyclotron resonance (ECR) technique, so as to irradiate the hydrogen ions having an acceleration energy as low as 10 to 20 eV to the silicon surface at a high density.

The resultant hydrogen ions do not react with the silicon, thereby removing the oxide film selectively from the silicon and causing substantially no damage on the diffused region 702. In addition, this process can be conducted at a room temperature, which prevents the variation in an impurity profile of the silicon substrate. In the publication, it is recited that a tungsten film 709 is formed by a deoxidizing reaction of $WF_6$ with silicon or hydrogen followed by formation of a sputtered aluminum film 710.

In the technique as described above, an open-circuit failure or a high connection resistance is sometimes observed in a small-sized and high-aspect ratio contact-hole. This is caused by the incomplete etching of the fluorocarbon based deposits 706, as shown in FIG. 1B, due to the lower energy hydrogen ions 707. The low energy hydrogen ions 707 can etch only a native oxide film after the fluorocarbon deposits 706 are completely removed in a large-sized and low-aspect ratio contact-hole, and leaves the fluorocarbon deposits 706 and a portion of the native oxide film 705 in the high-aspect ratio contact-hole 704.

Another example of the pretreatment is described in Patent Publication JP-A-2-26025. As shown in FIG. 2A, a field oxide film 802 is formed on a p-type silicon substrate 801 for defining a plurality of cell areas together with p-type channel stoppers 803, followed by formation of a gate oxide film 804 and a gate electrode 805 in each cell area. N-type source/drain diffused regions 806 and 807 are then formed in the cell area by self-alignment with the gate electrode 805, and an impurity blocking oxide film 808 is then formed thereon, followed by CVD of PSG to form an interlevel dielectric film 809.

A photoresist pattern having contact-holes 811A and 811B is then formed on the PSG film 809 by a photolithographic process to form the structure of FIG. 2A. Then, the PSG film 809 and the underlying blocking film 808 are subjected to a reactive ion etching using the photoresist pattern 810 as a mask to form contact-holes 814A and 814B in the PSG film 809 and the blocking film 808, for exposing the source/drain regions 806 and 807. In this step, damaged regions 812A and 812B having a thickness of about a few dozens angstroms are formed in the surface region of the portions of the source/drain regions 806 and 807 exposed by the contact-holes 814A and 814B.

Subsequently, the resist mask 810 is removed by an ashing step using an $O_2$ plasma, as shown in FIG. 2B. In this step, the damaged regions 812A and 812B grow to have a larger thickness of about 100 angstroms.

The substrate (951) formed by the steps of FIGS. 2A to 2C is then mounted on a target electrode 953 in a RIE chamber 952, as shown in FIG. 3. $O_2$ gas containing 20% $CF_4$ is introduced into the chamber 952 through an inlet tube 954 and evacuated therefrom through an outlet tube 955 while maintaining the internal pressure of the chamber 952 at about 1.2 Torr. A high-frequency power of about 1–2 watts/$cm^2$ density is then applied between the target electrode 953 and a counter electrode 956 for 20–60 seconds, thereby removing the damaged regions 812A and 812B by using excited oxygen and fluorine ions or radicals supplied from the plasma containing $O_2$ and $CF_4$.

In the another example, there is possibility of leakage current flowing from the $n^+$-diffused regions 806 and 807 to the silicon substrate 801 due to the enlarged damaged regions 817A and 817B of the silicon substrate. In addition, the concentration of the active oxygen ions is generally low in the RIE process, thereby necessitating a larger length of time for removal of the fluorocarbon based deposits. Further, the high pressure in the RIE process retards the anisotropic etching and provides substantially isotropic etching. As a result, after the fluorocarbon based deposits remaining in the corner regions of the contact-holes are removed, the top openings of the contact-holes are generally enlarged, as shown in FIG. 2C, which retards the high integration of the semiconductor device.

A third example of the pretreatment is described in Patent Publication JP-A-4-129217. First, as shown in FIG. 4A, a first level aluminum interconnect 1003 is formed as overlying a silicon substrate 1001 with an intervention of a silicon oxide film 1002 disposed therebetween. Subsequently, a silicon oxide film 1004 is formed as an interlevel dielectric film on the first level aluminum interconnect 1003, followed by a selective dry etching using a photoresist film as a mask for forming through-holes therein. After the photoresist film is removed and before a sputtering step for forming a second level interconnect, a pretreatment is conducted for removing the deposits, attached to the through-holes in the previous etching step, by a RIE technique using fluorine radicals or ions generated from a plasma containing argon gas added with fluorine based gas, such as $SF_6$ or $CF_4$.

The attached deposits are generally formed in the etching step as a material falling from the interlevel dielectric film. The attached deposits have a thickness as low as around several dozens of nanometers, and accordingly, the fluorine based gas may be added in a minute amount, such as in 5% of the argon gas. Or otherwise, i.e., if the amount is too large, the silicon oxide film 1004 is over-etched. Without exposing the resultant substrate, aluminum is sputtered onto the dielectric film 1004 having through-holes therein to form a second level aluminum film.

In the third example, the fluorocarbon based deposits 1006 are not effectively etched by the plasma 1008 containing argon gas added with fluorine, remain in the through-holes 1005 after the plasma etching, and cause voids or peel-off of the second level interconnect from the through-hole 1005. This is due to the fact that the plasma 1008 containing argon and fluorine does not chemically etch the fluorocarbon based deposits 1006.

The prior arts as described above do not effectively remove the fluorocarbon based deposits or oxide deposits remaining in a high-aspect ratio through-hole and a native oxide film or alumina film formed at the bottom of the through-hole.

SUMMARY OF THE INVENTION

It is an object of the present invention to provide a reliable through-hole having a high aspect ratio in a semiconductor device, by effectively removing the fluorocarbon based deposits attached to the inner wall of the through-hole and an oxide film formed at the bottom of the through-hole, thereby providing a reliable semiconductor device having a low contact resistance in the through-hole together with less open-circuit failure.

The present invention, in one aspect, provides a method for manufacturing a semiconductor device comprising the steps of forming an insulator film having a through-hole on a silicon substrate, plasma-treating inside the through-hole by a plasma containing argon, hydrogen and oxygen atoms, and forming a conductive layer filling the through-hole after the plasma-treating.

The present invention, in another aspect, also provides a method for manufacturing a semiconductor device comprising the steps of forming a first interconnect pattern, forming an insulator film having a through-hole for exposing a portion of the first interconnect pattern, plasma-treating inside the through-hole by a plasma containing argon, hydrogen and oxygen atoms, and forming a second interconnect pattern connected to the first interconnect pattern through the through-hole, after the plasma-treating.

In accordance with the present invention, the plasma treatment using a plasma containing argon, oxygen and hydrogen atoms effectively removes fluorocarbon based deposits from the inner wall of the through-hole and bottom of the through-hole. Especially the oxygen atoms effectively decompose the fluorocarbon based deposits.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1A:
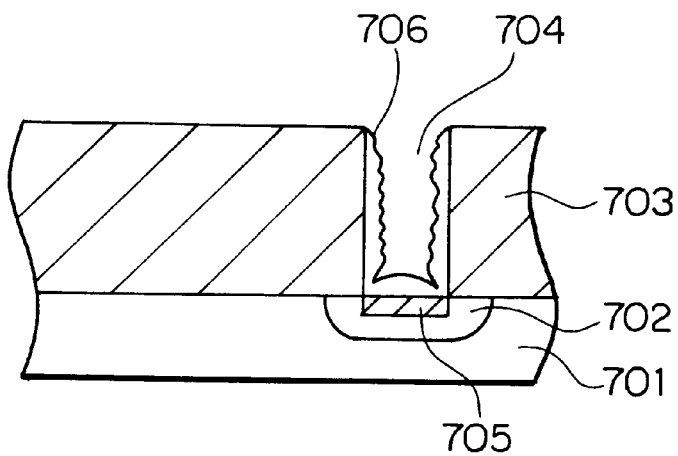
FIGS. 1A to 1C are cross-sectional views of a first conventional semiconductor device in consecutive steps of fabrication process therefor.
Figure 1B:
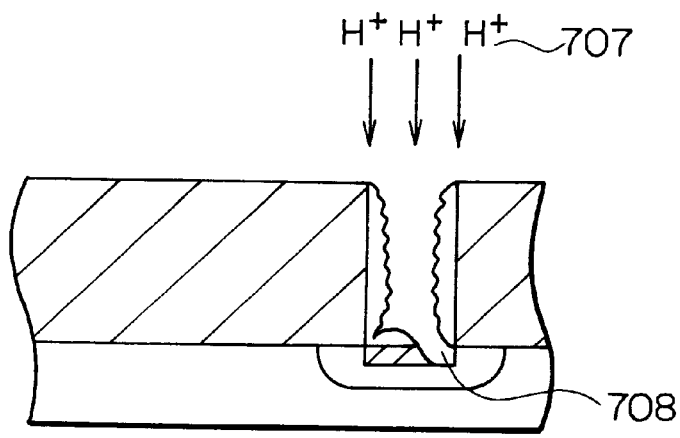
Figure 1C:
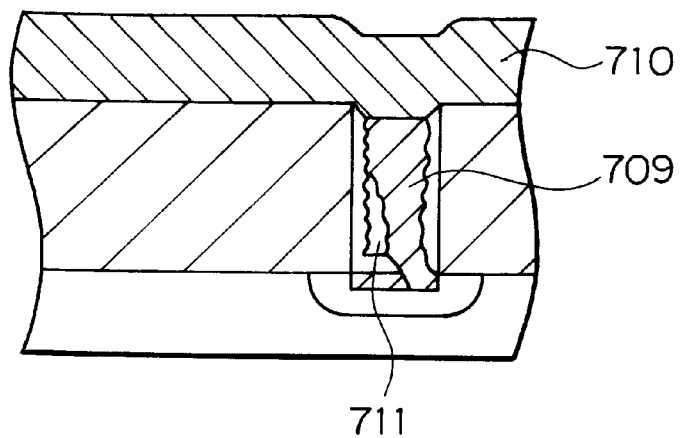
Figure 2A:
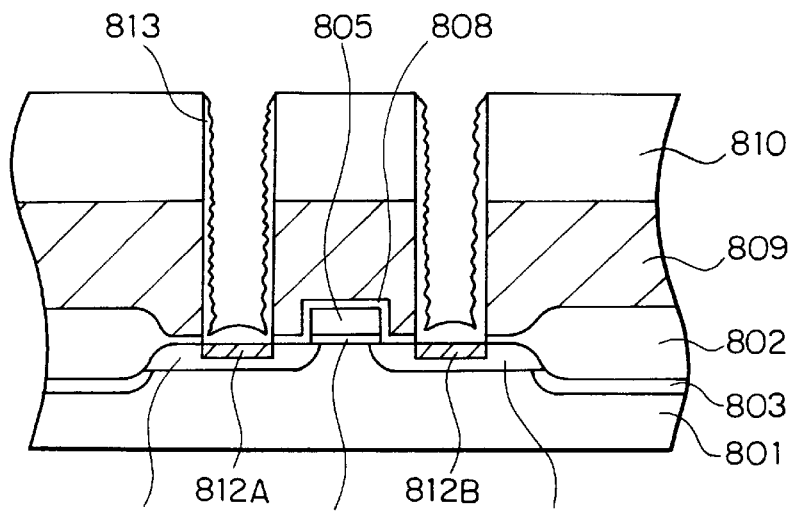
FIGS. 2A to 2C are cross-sectional views of a second conventional semiconductor device in consecutive steps of fabrication process therefor.
Figure 2B:
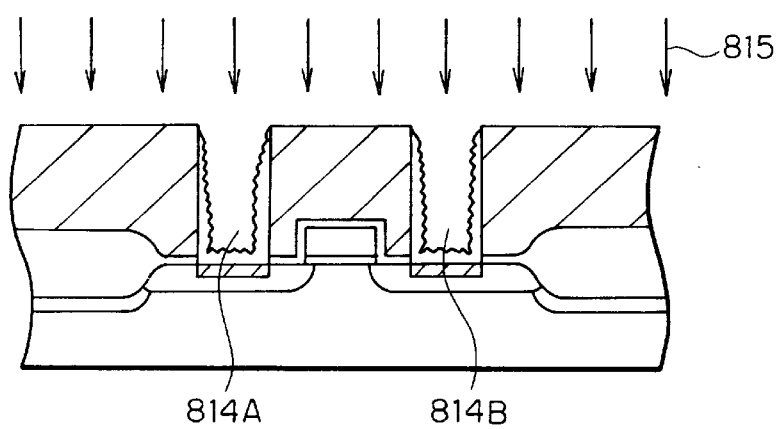
Figure 2C:
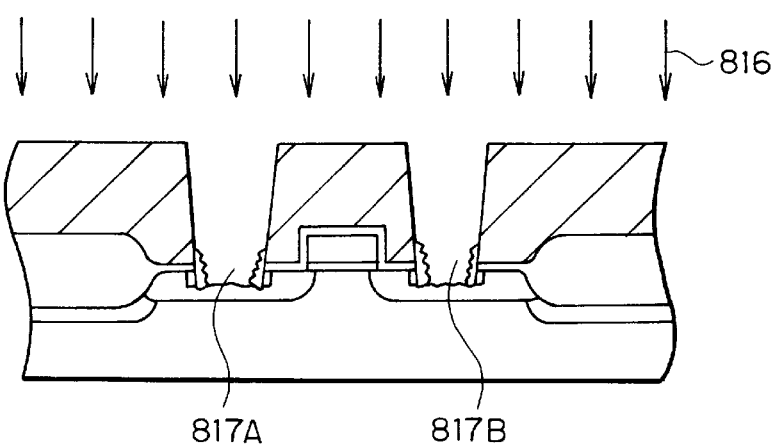
Figure 3:
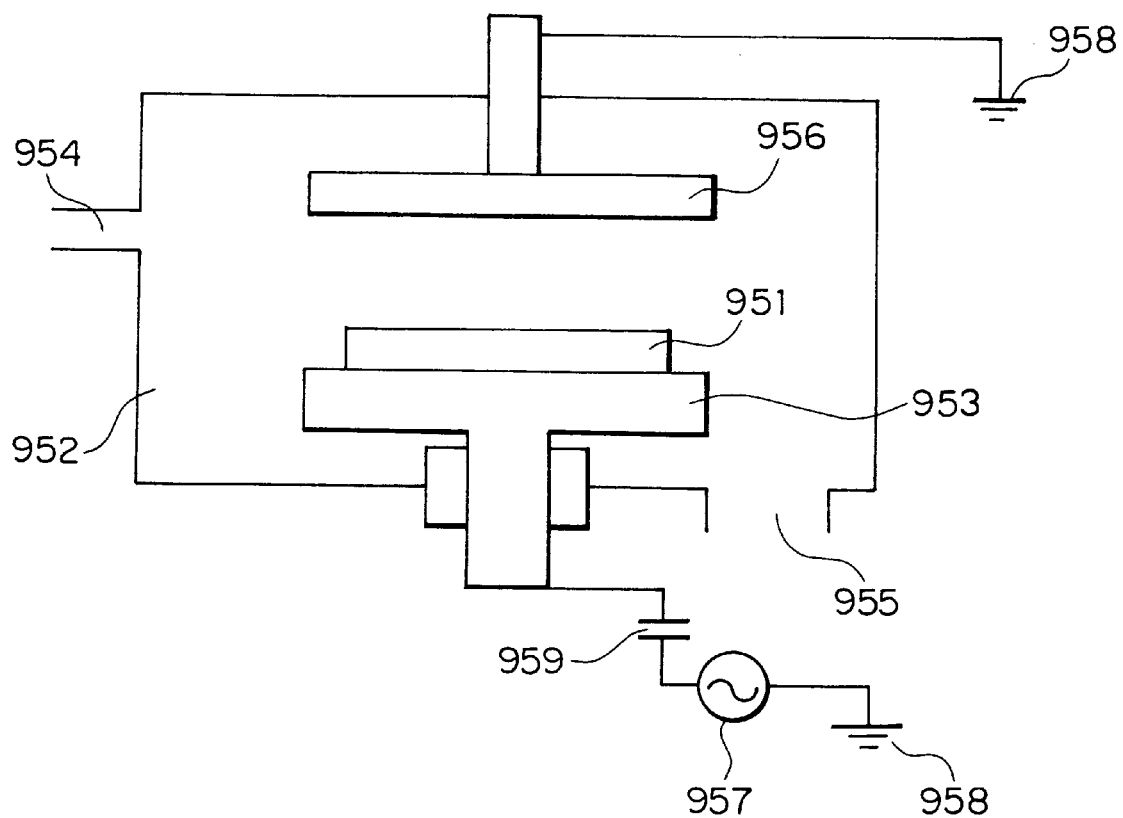
FIG. 3 is a schematic side view of a RIE plasma generator used for the second conventional semiconductor device at step of FIG. 2C.
Figure 4A:
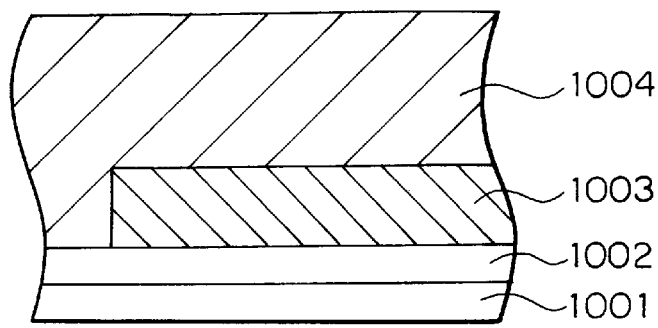
FIGS. 4A to 4C are cross-sectional views of a third conventional semiconductor device in consecutive steps of fabrication process therefor.
Figure 4B:
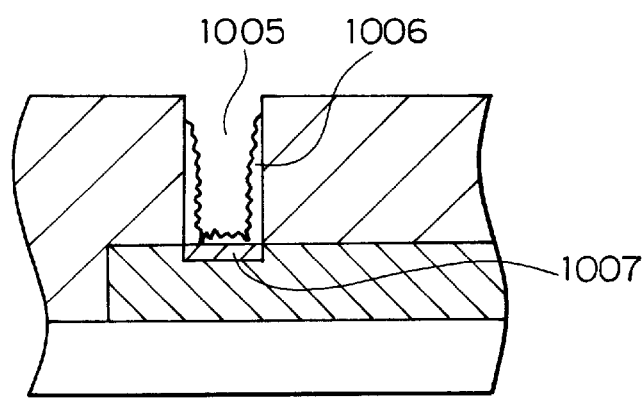
Figure 4C:
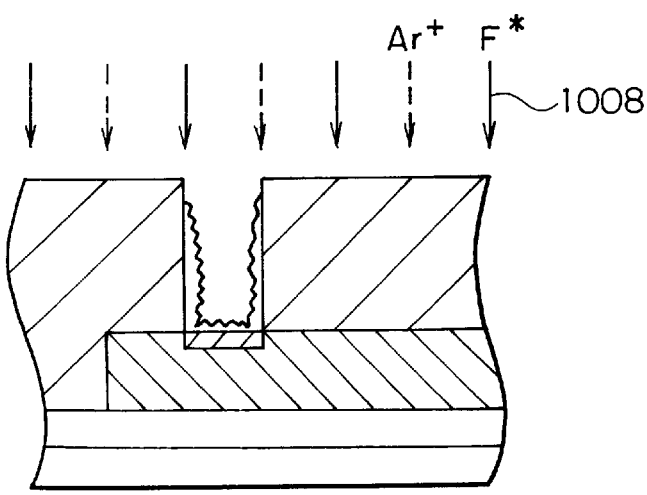
Figure 5:
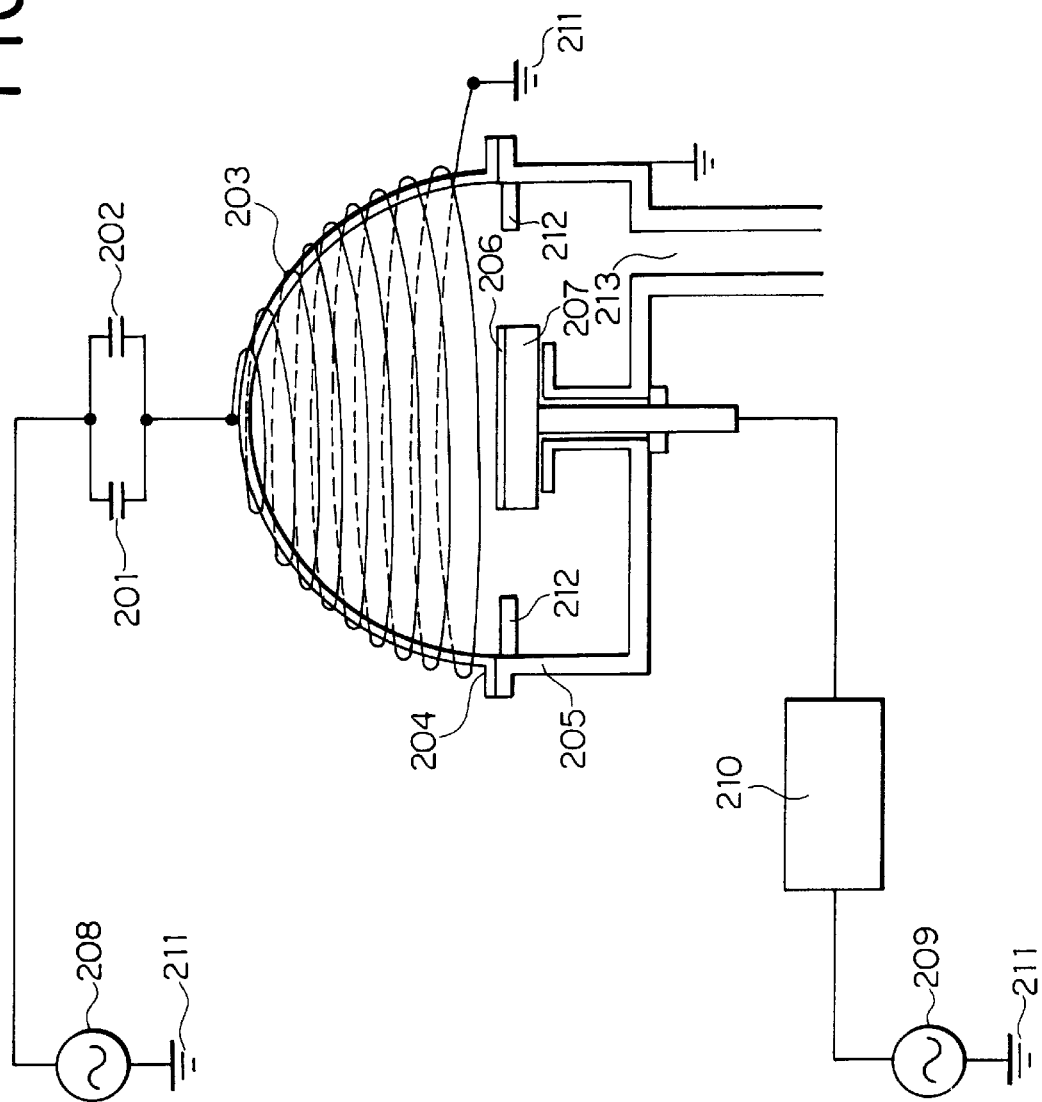
FIG. 5 is a schematic side view of an induction coupling high-density plasma generator used in fabrication of semiconductor devices according to embodiments of the present invention.

Referring to FIG. 5, there is shown an induction coupling plasma generator for plasma-treating inside through-holes of a semiconductor device according to embodiments of the present invention. The plasma generator as used in the present invention is similar to that disclosed in U.S. Pat. No. 5,346,578, the description of which is incorporated herein by reference.

A wafer 206 is mounted on a pedestal 207 disposed in a plasma chamber 205, into which a mixed gas containing oxygen, hydrogen and argon atoms is introduced through an inlet tube 212 while evacuating the mixed gas through an outlet tube 213, thereby maintaining the chamber pressure at about 10 mTorr. A high-frequency (AC) power is applied from a 450-kHz power source 208 through a pair of capacitors 201 and 202 and an induction coil 203 wound around an alumina bell jar 204 constituting a part of the chamber 205. The electric power shifts from the induction coil 203 to the plasma by an induction coupling through the alumina bell jar 204 of the chamber 205. A high-frequency power source 209 applies a high-frequency (AC) power to the pedestal 207 for biasing the wafer 206 through an automatic matching box 210 at a frequency of 13.56 MHz. Excited oxygen, hydrogen and argon ions or radicals are introduced into through-holes formed in the wafer 206 to etch both the fluorocarbon deposits in the through-hole and the native oxide film formed at the bottom of the through-hole.

Figure 6:
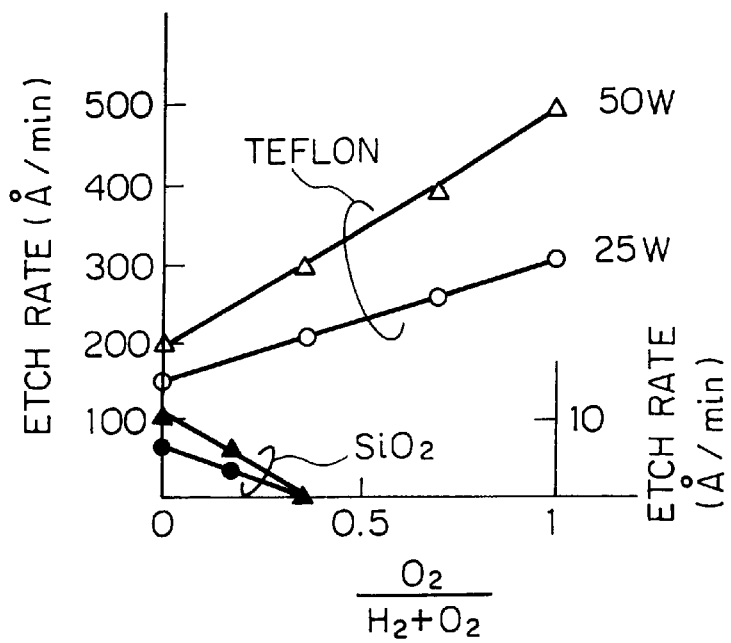
FIG. 6 is a graph for showing the etch rate of a Teflon film and an oxide film plotted against the ratio of the flow rate of $O_2$ to the total flow rate of $O_2$ and $H_2$.

Referring to FIG. 6, there is shown an $O_2$ flow rate dependency of the etch rate in a Teflon film and a $SiO_2$ film, obtained by the induction coupling plasma generator of FIG. 5. The $O_2$ flow rate is plotted on abscissa in the ratio of $O_2$ flow rate to the total flow rate of $O_2$ and $H_2$. The sample Teflon film was formed as the fluorocarbon based deposits by the plasma generator of FIG. 5 without applying the bias voltage to the wafer 206. In this step, the 450-kHz power source 208 was adjusted to output 1.2 kW, the 13.56-MHz power source 209 to output 0 kW. The flow rate of the exhaust gas was adjusted, with introduced $C_4F_8$ flow rate at about 70 sccm and $H_2$ flow rate at about 30 sccm, to maintain the chamber pressure at about 10 mTorr, thereby depositing the sample Teflon film directly on a silicon substrate. The sample $SiO_2$ film was thermally grown on a silicon substrate in a wet oxidation process at about 980° C. These sample films were subjected to plasma-etching by the plasma generator of FIG. 5 under the conditions of the output power by the 450-kHz power source 208 at 1.2 kW, the output power by the 13.56-MHz power source 209 at 25 W and 50 W, and the chamber pressure at about 3 mTorr, with the flow rate of introduced argon at about 10 sccm and the total flow rate of introduced $H_2$ and $O_2$ at about 50 sccm.

The etch rate of the Teflon film increased with the increase of the $O_2$ flow rate, whereas the $SiO_2$ film was etched by the presence of $H_2$ without $O_2$. The etch rate of the $SiO_2$ film decreased with the increase of the $O_2$ flow rate ratio, i.e., $O_2/O_2+H_2$, and became zero when the $O_2$ flow rate ratio exceeded 1/3. In this respect, it is preferable that the $O_2$ flow rate be less than 1/3 in the plasma containing argon, oxygen and hydrogen atoms.

The degree in which the etch rate of the $SiO_2$ film decreases with the increase of the oxygen flow rate ratio is higher in the case of a higher bias power being applied to the substrate, as shown in FIG. 6. This is considered due to the fact that a higher bias power for the substrate increases the DC bias voltage in the negative polarity to effectively collide the positive ions such as argon with the substrate, thereby increasing the etch rate.

A fluorocarbon film can be etched even in the mere presence of argon and hydrogen, as understood from FIG. 6. However, after the formation of through-holes, the pretreatment of the silicon surface in the mere presence of argon and hydrogen supplied from the plasma generator of FIG. 5 leaves fluorocarbon based deposits at the inner wall of the through-holes. This is considered due to the fact that there occurs substantially no physical etching of the fluorocarbon based deposits effected by ion collisions because of the vertical direction of the wall of the through-hole to which the fluorocarbon based deposits are attached. Accordingly, it is preferable that the ratio of $O_2$ flow rate to the total flow rate of $H_2$ and $O_2$ be larger than 1/100.

Figure 7:
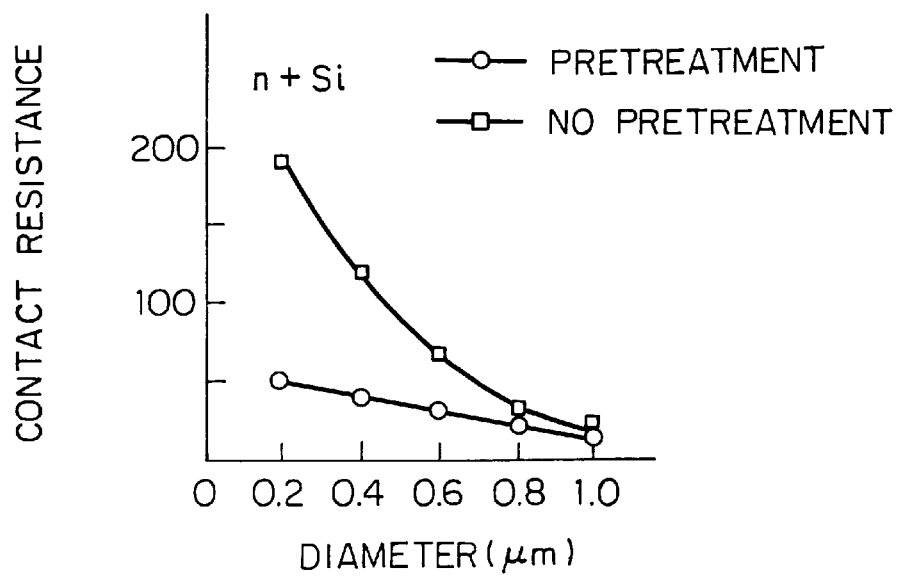
FIG. 7 is a graph for showing the contact resistance of $n^+$-diffused region plotted against the diameter of the contact-hole.

Referring to FIG. 7, there is shown a contact-hole size dependency of the contact resistance of the $n^+$-diffused region in the cases of the pretreatment and no such pretreatment being applied to the contact-holes formed in an insulation film having a thickness of about 2 μm. The etching was effected under the conditions of the power by the 450-kHz power source 208 at 1.2 kW, the power by the 13.56-MHz power source 209 at 50 W, and the chamber pressure at about 3 mTorr, with the argon flow rate at about 10 sccm, the $H_2$ flow rate at about 43 sccm, and the $O_2$ flow rate at about 7 sccm. In the graph, the contact resistance increases with the decrease of the diameter of the contact-hole, and can be suppressed by the pretreatment, however.

Figure 8:
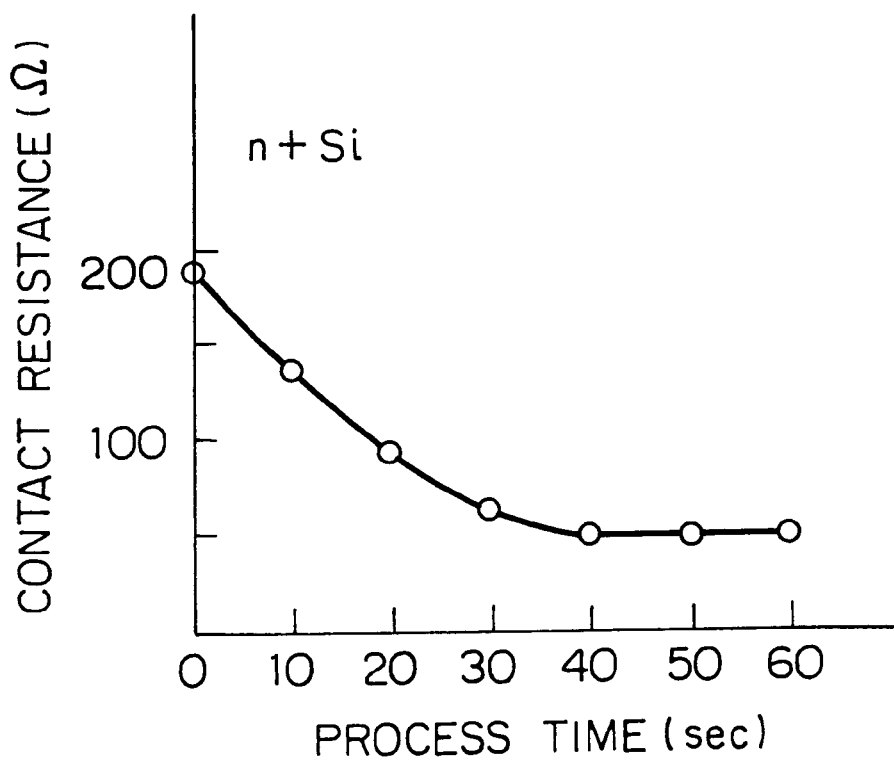
FIG. 8 is a graph for showing the contact resistance of $n^+$-diffused region plotted against the time length for a plasma treatment.

Referring to FIG. 8, there is shown a treatment time dependence of the contact resistance of $n^+$-diffused region in the case of the pretreatment being applied to a contact-hole having a diameter of 0.2-μm and formed in an insulator film having a thickness of about 2 μm. The etching was effected under the conditions of the power by the 450-kHz power source 208 at 1.2 kW, the power by the 13.56-MHz power source 209 at 50 W, and the chamber pressure at about 3 mTorr, with the argon flow rate at about 10 sccm, the $H_2$ flow rate at about 43 sccm, and the $O_2$ flow rate at about 7 sccm. In the graph, the contact resistance reduces with the increase in the time length of the plasma treatment, stays constant in the region above 40 seconds.

Referring to FIGS. 9A to 9D, a method for fabricating a multilevel interconnection structure according to an embodiment of the present invention will be described. First, an $n^+$-diffused region 102 is formed on a p-type silicon substrate 101, followed by formation of an insulator film 103 substantially made of $SiO_2$ and subsequent chemical mechanical polishing (CMP) thereof for planarization thereof in a chip area.

Subsequently, a photoresist pattern not shown is formed by a photolithographic technique, followed by dry-etching the insulator film 103 using the photoresist pattern as a mask to form a contact-hole 104. The conditions for dry-etching are selected so as to provide a high etch-rate ratio (selective ratio) between silicon oxide and silicon. For example, a high-density plasma, such as helicon wave plasma, is used and a high-frequency power is applied to the semiconductor substrate. The etching is effected in the presence of an etching gas containing $C_4F_8$ added with $H_2$ to provide the high etch-rate ratio. In a practical example of the present embodiment, 13.56-MHz power source applied 1.5 kW RF power to the source of the high-density plasma, and the 450-kHz power source applied 100 W to the substrate. The etching gas contained 30 sccm $C_4F_8$ and 10 sccm $H_2$.

The etching conditions for the contact-hole as employed in the present embodiment generates fluorocarbon based deposits 106 on the silicon substrate and fill the contact-hole 104 after the silicon surface is exposed. Especially, in the case of presence of different contact-holes 104 having different depths, an over-etching of the deep contact-holes will fill the shallower contact-holes with fluorocarbon based deposits.

Figure 9A:
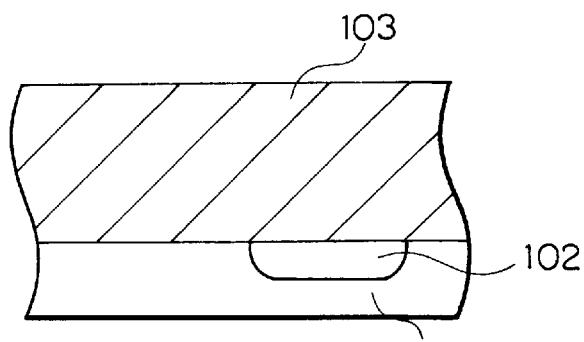
FIGS. 9A to 9D are cross-sectional views of a semiconductor device in consecutive steps of fabrication process according to a first embodiment of the present invention.
Figure 9B:
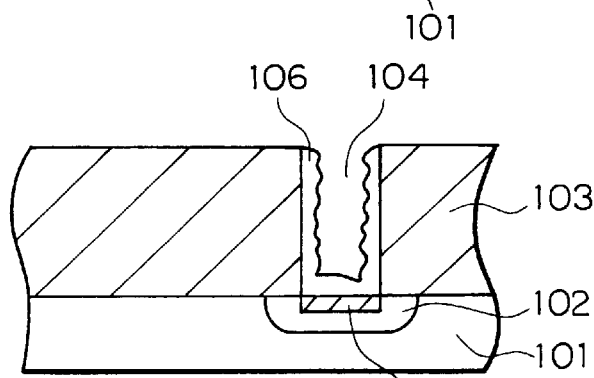

After the photoresist is removed by oxygen plasma ashing using a plasma generated by a barrel-type plasma generator, as shown in FIG. 9B, fluorocarbon based deposits 106 remain in the contact-hole 104. Damaged regions 105 formed in the silicon substrate 101 has a small depth due to the conditions in that the etch-rate ratio between silicon oxide and silicon is a maximum. This is due to the fluorocarbon based deposits 106 cover the silicon surface just after the silicon surface is exposed. The remaining fluorocarbon based deposits 106 suppress the growth of a native oxide film which generally grows on the silicon surface due to the presence of the water left in the contact-hole during the removal of the photoresist pattern.

Figure 9C:
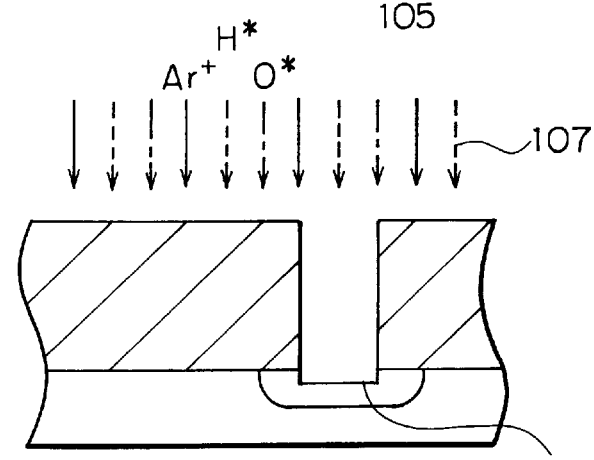

Subsequently, a cleaning pretreatment is conducted, as shown in FIG. 9C, by using the plasma generator of FIG. 5, for example, before sputtering a metal. In the practical example, the plasma pretreatment was conducted for 1 minute with the conditions of the power by the 450-kHz power source at 1.2 kW, the power by the 13.56-MHz power source at 50 W, the chamber pressure at about 3 mTorr, the argon flow rate at about 10 sccm, the $H_2$ flow rate at about 43 sccm, and the $O_2$ flow rate at about 7 sccm. In the plasma pretreatment, the plasma including a large amount of active oxygen and hydrogen ions chemically removes the fluorocarbon based deposits in the form of volatile gases such as CO, $CO_2$, CHX and HF. Especially, addition of oxygen accelerates the decomposition of the deposits. The high-density plasma generates a large amount of the active oxygen and active hydrogen, whereas the high-frequency bias voltage applied to the silicon substrate in the presence of argon ions further accelerates the decomposition of the deposits in the contact-hole due to the collision by the accelerated argon ions.

Figure 9D:
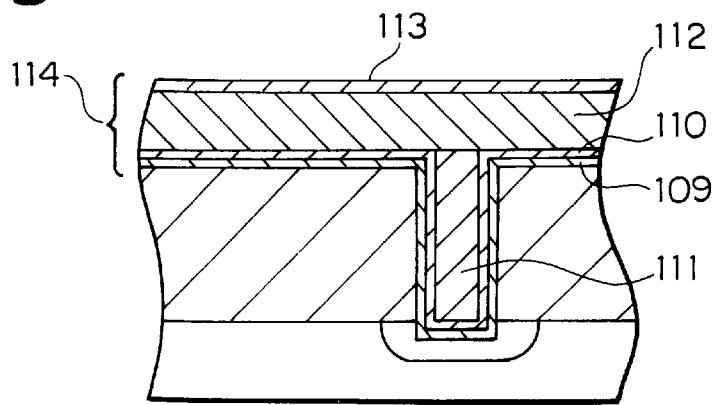

After the pretreatment, without exposing the wafer to the atmosphere, a 50-nm thick titanium film 109 and a 50-nm thick titanium nitride film 110 are formed by sputtering as barrier metals. A thick tungsten film is then grown thereon, followed by etch-back thereof to leave the tungsten plug 111 in the contact-hole 104. A 0.6-μm thick Al—Cu alloy film and a 0.05-μm thick anti-reflectance titanium nitride film are then formed, followed by patterning using a photolithographic technique to form an interconnect pattern 114 including, from the top to the bottom, titanium nitride film 113, Al—Cu alloy film 112, titanium nitride film 110 and titanium film 109, as shown in FIG. 9D. The interconnect pattern 114 is connected to the diffused region 102 of the silicon substrate 101 via the contact-hole 104.

Figure 10A:
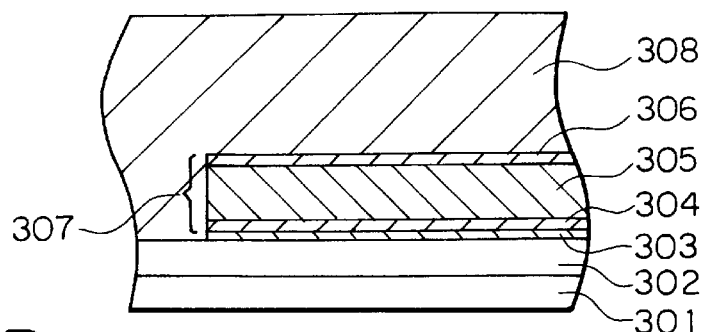
FIGS. 10A to 10D are cross-sectional views of a semiconductor device in consecutive steps of fabrication process according to a second embodiment of the present invention.

Referring to FIGS. 10A to 10D, there is shown a method for fabricating an interconnection structure according to a second embodiment of the present invention. First, as shown in FIG. 10A, an insulator film 302 substantially made of $SiO_2$ is formed on a silicon substrate 301, followed by sputtering thereon a titanium film 303, a titanium nitride film 304, a 0.6-μm thick Al—Cu alloy film 305, and a 0.05-μm thick anti-reflectance titanium nitride film 306. The sputtered films are then patterned by selective etching using photolithographic and dry-etching techniques to form a first level interconnect pattern 307. Thereafter, an interlevel dielectric film 308 substantially made of $SiO_2$ is formed on the first level interconnection pattern 307 and the insulator film 302, followed by CMP for planarization thereof.

Subsequently, via-holes 309 are formed in the interlevel dielectric film by using photolithographic and dry-etching techniques, wherein a high-density plasma such as helicon wave plasma is used while applying a high-frequency power to the silicon substrate 301. $C_4F_8$ gas added with $H_2$ is used as an etching gas at a pressure below 10 mTorr. Combination of the high-density plasma source used in a low pressure ambient and the high-frequency power applied to the silicon substrate 301 can provide a vertical via-hole of desirable shape at a high etch-rate. In a practical example, a helicon wave plasma source was used which was applied with a 13.56-MHz RF power of 1.5 kW, while a 450-kHz bias voltage is applied to the silicon substrate at a 100 W power. The etching gas contained 40-sccm $C_4F_8$ and 15-sccm $H_2$.

Figure 10B:
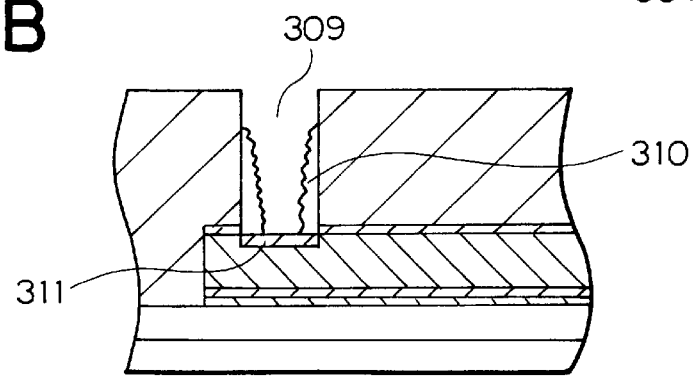

After the first level interconnect pattern 307 is exposed, fluorocarbon based material is deposited to fill the via-holes 309, as shown in FIG. 10B. In particular, if an over-etching is conducted in consideration of the variation in the thickness of the interlevel dielectric film within a wafer or between wafers, it is more likely that small-sized and high-aspect ratio via-holes are filled with the fluorocarbon based deposits 310. After the dry-etching step, the photoresist is removed by an oxygen plasma ashing generated by a barrel-type plasma generator, fluorocarbon based deposits 310 are left in the high-aspect ratio via-holes 309 and damaged regions 311 are formed on the first level interconnect pattern 307 in the bottom of the via-holes 309, as shown in FIG. 10B.

Subsequently, a cleaning pretreatment is conducted, before sputtering a metallic material, by using the plasma generator of FIG. 5. In the practical example, 1.5 kW was applied from the 450-kHz power source 208, 80 W was applied from the 13.56-MHz power source 209 for one minute, with the cleaning gas being 15-sccm argon, 40 sccm $H_2$ and 7-sccm $O_2$.

Figure 10C:
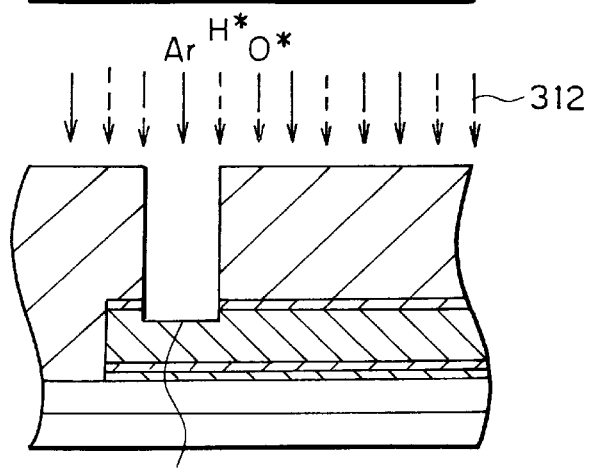

Subsequently, as shown in FIG. 10C, the via-holes 309 are subjected to a plasma treatment using a plasma containing argon, hydrogen and oxygen atoms to remove the fluorocarbon based deposits 310. In this step, active hydrogen and oxygen ions chemically remove the fluorocarbon based deposits 310 in the form of volatile gases such as CO, $CO_2$, $CH_x$ and HF. Especially, the oxygen ions in the etching gas accelerates the decomposition of the fluorocarbon based deposits 310, whereas the high-density plasma source generates a large amount of active hydrogen and oxygen ions. The argon in the etching gas and the high-frequency bias voltage applied to the silicon substrate further accelerate the decomposition in the via-holes 309 due to the collision by the accelerated argon ions.

Figure 10D:
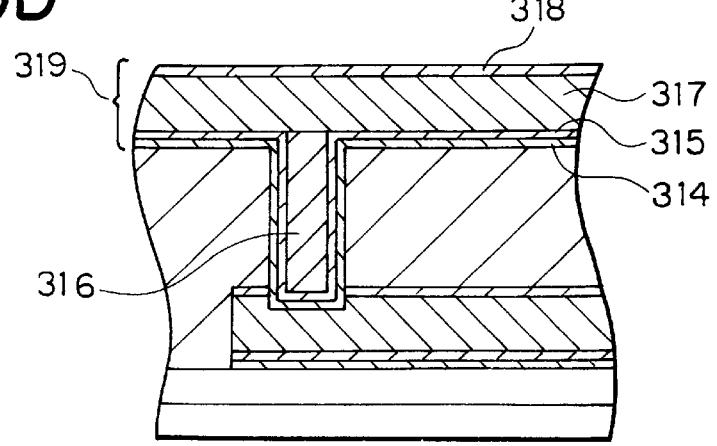

After the pretreatment, without exposing the wafer to the atmosphere, a 50-nm thick titanium film 314 and a 50-nm thick titanium nitride film 315 are formed as barrier metals over the entire surface by sputtering. A thick tungsten film is then grown on the entire surface, followed by etch-back thereof using a dry-etching technique to leave a tungsten plug 316 in the via-hole 309. Thereafter, a 0.6-$\mu$m thick Al—Cu alloy film and a 0.05-$\mu$m thick anti-reflection titanium nitride film are formed thereon, followed by a selective etching by using photolithographic and dry-etching techniques to form a second level interconnect pattern 319 including, from the top to the bottom, titanium nitride film 318, Al—Cu alloy film 317, titanium nitride film 315 and titanium film 314, as shown in FIG. 10D.

In the above plasma treatment, the number of oxygen atoms is less than half the number of hydrogen atoms to obtain a reducing or deoxidizing ambient for the plasma treatment, which enables removal of the oxide film formed on the bottom of the through-hole without forming an additional oxide film on the surface of the silicon substrate or interconnect pattern.

What is claimed is:

1. A method for manufacturing a semiconductor device comprising the steps of forming an insulator film having a through-hole on a silicon substrate, plasma-treating inside said through-hole by a plasma containing argon, hydrogen and oxygen atoms, wherein the ratio of the number of said oxygen atoms to the total number of said oxygen atoms and hydrogen atoms is less than about 1/3, and forming a conductive layer filling said through-hole after said plasma-treating.

2. A method as defined in claim 1, wherein the number of said oxygen atoms is less than half the number of said hydrogen atoms.

3. A method as defined in claim 1, wherein the ratio is more than about 1/100.

4. A method as defined in claim 1, wherein said plasma-treating is conducted while applying a AC bias voltage to said silicon substrate.

5. A method as defined in claim 1, wherein said plasma is generated by an inductive coupling plasma generator.

6. A method as defined in claim 1, wherein said plasma-treating removes fluorocarbon based deposits from said through-hole.

7. A method as defined in claim 1, wherein said plasma is a helicon wave plasma.

8. A method for manufacturing a semiconductor device comprising the steps of forming a first interconnect pattern, forming an insulator film having a through-hole for exposing a portion of said first interconnect pattern, plasma-treating inside said through-hole by a plasma containing argon, hydrogen and oxygen atoms, wherein the ratio of the number of said oxygen atoms to the total number of said oxygen atoms and hydrogen atoms is less than about 1/3, and forming a second interconnect pattern connected to said first interconnect pattern through said through-hole after said plasma-treating.

9. A method as defined in claim 8, wherein the number of oxygen atoms is less than the number of said hydrogen atoms.

10. A method as defined in claim 8, wherein the ratio is more than about 1/100.

11. A method as defined in claim 8, wherein said plasma-treating is conducted while applying a AC bias voltage to said silicon substrate.

12. A method as defined in claim 8, wherein said plasma is generated by an inductive coupling plasma generator.

13. A method as defined in claim 8, wherein said plasma-treating removes fluorocarbon based deposits from said through-hole.

14. A method as defined in claim 8, wherein said plasma is a helicon wave plasma.

* * * * *